(12) United States Patent
Hamaya et al.

(10) Patent No.: US 9,804,510 B2
(45) Date of Patent: Oct. 31, 2017

(54) INTERFEROMETER SYSTEM, LITHOGRAPHY APPARATUS, AND ARTICLE MANUFACTURING METHOD

(71) Applicant: CANON KABUSHIKI KAISHA, Tokyo (JP)

(72) Inventors: Zenichi Hamaya, Utsunomiya (JP); Ryo Takai, Utsunomiya (JP); Shinichiro Hirai, Saitama (JP); Takeshi Rokukawa, Utsunomiya (JP); Takashi Miura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 273 days.

(21) Appl. No.: 14/153,538

(22) Filed: Jan. 13, 2014

(65) Prior Publication Data

US 2014/0198307 A1     Jul. 17, 2014

(30) Foreign Application Priority Data

Jan. 17, 2013   (JP) .................................. 2013-006617

(51) Int. Cl.
*G03B 27/52*     (2006.01)
*G03B 27/42*     (2006.01)
(Continued)

(52) U.S. Cl.
CPC ..... *G03F 7/70883* (2013.01); *G01B 9/02062* (2013.01); *G03F 7/7085* (2013.01); *G03F 7/70325* (2013.01); *G03F 7/70808* (2013.01); *G03F 7/70833* (2013.01); *G03F 9/7049* (2013.01)

(58) Field of Classification Search
CPC ............ G01B 9/02062; G01B 9/02015; G01B 9/02029; G01B 9/0203; G01B 9/02049; G01B 9/02052; G03F 7/70325; G03F 7/70691; G03F 7/707; G03F 7/70716; G03F 7/70725; G03F 7/70758; G03F 7/70775; G03F 7/70808; G03F 7/70833; G03F 7/7085; G03F 7/70858; G03F 7/70883;
(Continued)

(56) References Cited

U.S. PATENT DOCUMENTS 4,814,625 A * 3/1989 Yabu ................... G03F 7/70858
                                                            250/492.1
5,146,284 A * 9/1992 Tabarelli ................ G01D 5/266
                                                              356/487
(Continued)

FOREIGN PATENT DOCUMENTS

JP          H11-44506 A        2/1999

*Primary Examiner* — Christina Riddle
(74) *Attorney, Agent, or Firm* — Carter, DeLuca, Farrell & Schmidt, LLP

(57) ABSTRACT

Provided is an interferometer system that irradiates an object to be measured with measuring light to thereby measure the position of the object to be measured. The interferometer system includes a laser light source; an interferometer configured to separate laser light emitted from an emission opening of the laser light source into the measuring light and reference light; and an optical path protecting member configured to surround an optical axis such that the laser light passes through the inside thereof and of which one opening is in contact with the emission opening.

14 Claims, 5 Drawing Sheets

(51) Int. Cl.
*G03B 27/58* (2006.01)
*G03B 27/62* (2006.01)
*G03F 7/20* (2006.01)
*G01B 9/02* (2006.01)
*G03F 9/00* (2006.01)

(58) Field of Classification Search
CPC ............ G03F 7/70908; G03F 7/70916; G03F 9/7007; G03F 9/7015; G03F 9/7049
USPC ........... 355/30, 53, 67–77; 250/492.1, 492.2, 250/492.22, 548; 356/4.09, 28.5, 450, 356/477, 496–516
See application file for complete search history.

(56) References Cited

U.S. PATENT DOCUMENTS

| | | | | |
|---|---|---|---|---|
| 5,325,177 A | * | 6/1994 | Peterson | G01B 11/12 356/505 |
| 5,359,415 A | * | 10/1994 | Tabarelli | G01B 9/02051 356/482 |
| 5,469,260 A | * | 11/1995 | Takagi | G03F 7/70716 355/30 |
| 5,552,888 A | * | 9/1996 | Sogard | G03F 7/70691 250/548 |
| 5,875,031 A | * | 2/1999 | Owa | G01B 9/02052 356/500 |
| 6,034,773 A | * | 3/2000 | Nishimura | G01B 9/02052 356/498 |
| 6,697,162 B1 | * | 2/2004 | Sakai | G01B 9/02052 356/500 |
| 2003/0098959 A1 | * | 5/2003 | Hagiwara | G03F 7/70041 355/69 |
| 2008/0291464 A1 | * | 11/2008 | Sogard | G03F 7/70775 356/500 |
| 2009/0046297 A1 | * | 2/2009 | Sogard | G03F 7/70775 356/498 |
| 2009/0201479 A1 | * | 8/2009 | Arai | B23K 26/032 355/67 |

* cited by examiner

INTERFEROMETER SYSTEM, LITHOGRAPHY APPARATUS, AND ARTICLE MANUFACTURING METHOD

BACKGROUND OF THE INVENTION

Field of the Invention

The present invention relates to an interferometer system, a lithography apparatus, and an article manufacturing method.

Description of the Related Art

There has been known an interferometer system including an interferometer that measures the position of an object to be measured using laser light emitted from a laser light source. In the interferometer system, the laser light emitted from the light source is firstly guided to the interferometer after splitting by a beam splitter or after folding by a mirror. Next, the interferometer separates the laser light into measuring light and reference light, and detects an interference signal generated by superposition of the measuring light returned by reflection from the object to be measured and the reference light. Consequently, the difference in displacement between the measuring light and the reference light is derived, so that the position of the object to be measured can finally be specified. Here, when any one of temperature, pressure, and humidity changes in an optical path through which either the measuring light or the reference light passes, the refractive index of air changes. Thus, a measurement error may occur by the difference between the measuring light and the reference light both of which have been adversely affected due to a change in the refractive index of air. Accordingly, in order to reduce the occurrence of measurement error, there is also an interferometer system that is provided with a cover on an optical path or is provided with a device which performs local air-conditioning control. In contrast, in the common optical path, through which the superposed measuring light and reference light pass, from the light source to the interferometer, it has been conventionally thought that no measurement error caused by a change in refractive index itself which is changed by variations in temperature or the like occurs in principle. This is because, since the optical path is common to both measuring light and reference light, no optical path length difference occurs if both the measuring light and the reference light are subject to the same change. However, when three hours or greater is taken for measurement, the impact of a nonlinear error caused by a change in pressure or the like may not be ignored even by such a laser interferometer. Accordingly, Japanese Patent Laid-Open No. H11-44506 discloses an interferometer measuring apparatus that seals an optical path with a sealing pipe such that a common optical path is not affected by the exterior environment, particularly, pressure.

However, even when an optical path is sealed with a sealing pipe so as not to be affected by a change in refractive index as disclosed in Japanese Patent. Laid-Open No. H11-44506, a measurement error may occur in a short-time measurement which is substantially immune to pressure variations or the like if a portion open to atmosphere is present in at least a part of the common optical path. This is because, since the refractive index distribution occurs in the common optical path and the interface between airs having different refractive indices constantly changes upon the occurrence of airflow, the angle of laser light (optical axis) also changes with a change in interface. When the angle of laser light changes in the optical path, the irradiation position of measuring light on the object to be measured changes by an amount proportional to the distance from the position at which a change in angle occurs to the object to be measured. FIGS. 7A and 7B are reference diagrams illustrating a measurement error for comparison. Here, if a surface 40 to be measured and measuring light 41 are perfectly orthogonal to each other as shown in FIG. 7A, a measurement error $E_1$ occurs as the approximate $L(1-\cos \theta)$ from the relationship between an optical path length L and an angle change θ. In contrast, when the surface 40 to be measured is offset from the measuring light 41 by an offset $\theta_2$ from the orthogonal relationship as shown in FIG. 7B, an additional measurement error $E_2$ occurs as the product of L and $\tan \theta_1 \tan \theta_2$. In this case, examples of factors for causing a change in refractive index in the common optical path include a change in temperature caused by a laser light source. The temperature of the laser light source is typically controlled by using a heater in order to stabilize the wavelength of laser light. Thus, the laser light source itself is a large heat-generating source. In particular, a large temperature distribution is formed in the vicinity of an emission opening for emitting laser light. In other words, even when an optical path is sealed with a sealing pipe as disclosed in Japanese Patent Laid-Open No. H11-44506, a measurement error may occur due to a change in refractive index interface caused by temperature change of the laser light source if a gap which is open to atmosphere is present between the sealing pipe and the laser light source.

SUMMARY OF THE INVENTION

The present invention provides, for example, an interferometer system that is advantageous to reduction of a measurement error when the position of an object to be measured is measured by using a laser interferometer.

According to an aspect of the present invention, an interferometer system that irradiates an object to be measured with measuring light to thereby measure a position of the object to be measured is provided that includes a laser light source; an interferometer configured to separate laser light emitted from an emission opening of the laser light source into the measuring light and reference light; and an optical path protecting member configured to surround an optical axis such that the laser light passes through the inside thereof and of which one opening is in contact with the emission opening.

Further features of the present invention will become apparent from she following description of exemplary embodiments with reference to the attached drawings.

DESCRIPTION OF THE EMBODIMENTS

Hereinafter, preferred embodiments of the present invention will now be described with reference to the accompanying drawings.

First Embodiment

Figure 1:
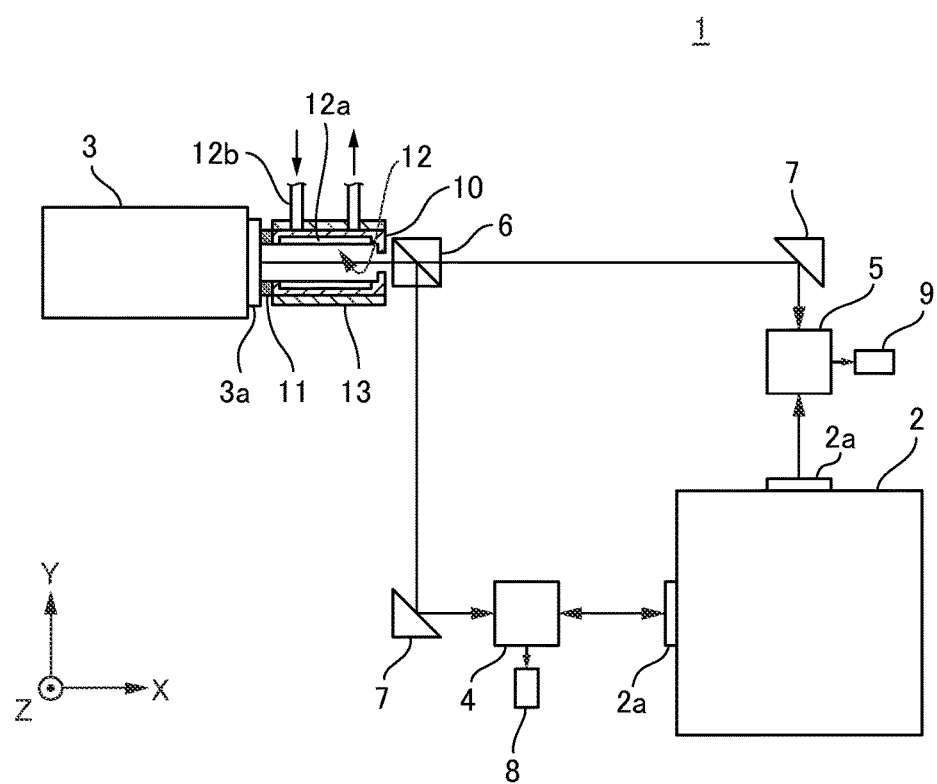
FIG. 1 is a diagram illustrating a configuration of an interferometer system according so a first embodiment of the present invention.

Firstly, a description will be given of an interferometer system according to a first embodiment of the present invention. The interferometer system of the present embodiment employs a laser interferometer and specifies the position of an object to be measured which is movable in any direction by measuring the distance to the object to be measured. FIG. 1 is a schematic diagram illustrating a configuration of an interferometer system 1 according to the present embodiment. In FIG. 1, the Z-axis is set in the direction parallel to the perpendicular direction (in the present embodiment, vertical direction) of the plane of motion of an object to be measured 2, the X-axis is set in one scanning direction within the plane of motion, and the Y-axis is set in other scanning direction orthogonal to the X-axis. As an example, the interferometer system 1 measures the object to be measured 2 from the X and Y two axial directions by setting the XY stage which moves within the XY plane as the object to be measured 2 as shown in FIG. 1. The interferometer system 1 includes a laser light source (laser light source unit). The term "laser light source" used herein refers to a light-emitting source directly emitting laser light or a housing of a product including a light-emitting source therein. In particular, in the present embodiment, a description will be given of a case where a laser light source is a housing of a product including a light-emitting source therein. The interferometer system 1 has a housing 3 including a laser-emitting source, a laser interferometer (hereinafter referred to as "first interferometer") 4 that irradiates the object to be measured 2 with measuring light in the X-axis direction, and a laser interferometer (hereinafter referred to as "second interferometer") 5 that irradiates the object to be measured 2 with measuring light in the Y-axis direction. Reflectors (reflecting mirrors) 2a for reflecting measuring light radiated from the interferometers 4 and 5 facing thereto are provided on the side surfaces of the object to be measured 2 in the X- and Y-axial directions. The housing 3 including the laser-emitting source emits laser light (linearly polarized light orthogonal to each other) towards two interferometers 4 and 5. A heater (not shown) is provided on the inside or outside of the housing 3 including the laser-emitting source in order to stabilize the wavelength of laser light so that the temperature of the housing 3 is controlled. Each of two interferometers 4 and 5 includes a polarized beam splitter that separates laser light into measuring light and reference light. The interferometer system 1 also includes a beam splitter 6 for splitting laser light emitted from the housing 3 including the laser-emitting source into two light beams and a folding mirror 7 for reflecting and routing laser light to a predetermined position in the common optical path, through which laser light travels, from the housing 3 to two interferometers 4 and 5. Light receivers 8 and 9 for receiving the measuring light returned by reflection from the object to be measured and the reference light are provided within two interferometers 4 and 5, respectively. Each of the light receiver 8 (the first interferometer 4) and the light receiver 9 (the second interferometer 5) detects an interference signal generated by superposition of the measuring light returned by reflection from the object to be measured 2 and the reference light. At this time, an interference signal output from the light receiver 8 or the light receiver 9 is transmitted to a controller (signal processor, not shown) which is provided on the inside or outside of the interferometer system 1, and the controller specifies (calculates) the position of the object to be measured 2 based on a difference in displacement of the received interference signals. When it is assumed that the interferometer system 1 is employed in an exposure apparatus 20 to be described below with reference to FIG. 3, a controller 27 may be responsible for or play a role of the controller.

Furthermore, the interferometer system 1 includes an optical path protecting member 10 for covering an optical path at an emission opening 3a for emitting laser light from the housing 3 including the laser-emitting source. Here, the housing 3 including the laser-emitting source has a heater for stabilizing the wavelength of laser light, and thus, also serves as a heat generating source. Thus, when the vicinity of the emission opening 3a is open to atmosphere, a flow of air is generated by forming a large temperature distribution, and thus, the interface between airs having different refractive indices constantly changes, resulting in an angle change of laser light (light beam). Since the angle change may cause a measurement error, it is preferable that the occurrence of such an angle change is suppressed. Accordingly, in the present embodiment, the flow of air which may flow into the vicinity of the emission opening 3a is blocked by the optical path protecting member 10, so that the occurrence of an angle change of laser light is suppressed.

Firstly, the optical path protecting member 10 is a tubular member of which the cross section is a circle or a rectangular, and the laser light emitted from the housing 3 including the laser-emitting source passes inside the tubular member. Here, it is also contemplated that the internal space of the optical path protecting member 10 is isolated (sealed) from the external space thereof by simply providing optical glasses (transmitting windows) at openings on the laser light-incidence side and the laser light-emission side of the optical path protecting member 10 such that the interior of the optical path protecting member 10 is unaffected from the exterior thereof. However, transmission of laser light through the optical glass may lead to the occurrence of a measurement error caused by the following events. These events include a light quantity loss caused by reflection from the glass surface, polarized light leakage caused by retardation which may be caused by birefringence in the glass, the occurrence of a nonlinear measurement error caused by a wavefront change, the angle change of the optical axis due to a change in the degree of parallelism caused by glass heat deformation (shrinkage or expansion), and the like. Thus, it is preferable that an optical member such as an optical glass is not arranged as much as possible in the optical path of laser light. Accordingly, one opening of the optical path protecting member 10 (the opening on the laser light-incidence side) is firstly brought into contact with the emission opening 3a of the housing 3 including the laser-emitting source via a sealing member 11. As the sealing member 11, an O-ring made of fluorine rubber may be employed. In addition, a fluorine rubber sponge, a gasket, or the like may also be employed. When the optical path protecting member 10 is not detached from the emission opening 3a, the sealing member 11 may be employed as adhesive. In this manner, she vicinity of the emission opening 3a which is readily affected by she flow of air if the emission opening 3a is open to atmosphere can be blocked such that the flow of air to the surrounding environment such as heat convection caused by the housing 3 including the laser-emitting source or the like is not transferred to the interior of the optical path protecting member 10. In contrast, the other opening of the optical path protecting member 10 (the opening on the laser light-emission side) is positioned in close proximity of the beam splitter 6, and a portion of the other opening through which laser light, passes is open to atmosphere for reasons as described above. The material, of the optical path protecting member 10 may preferably be an aluminum alloy or may also be other metal materials. A resin material such as POM (polyacetal) having low thermal conductivity or ceramics may also be employed for the optical path protecting member 10 such that the optical path protecting member 10 is less sensitive to thermal effect from the exterior thereof.

The optical path protecting member 10 also has a temperature controller 12 that controls the temperature of the internal space thereof to be constant. As shown in FIG. 1, the temperature controller 12 has, for example, a passage 12a that circulates cooling water in the inner surfaces of the optical path protecting member 10. The passage 12a is connected to a supply/recovery unit (not shown) disposed on the exterior of the optical path protecting member 10 via a line 12b through a hole formed in the wall portion of the optical path protecting member 10. The supply/recovery unit supplies and recovers cooling water of which the temperature is adjusted so as to circulate the cooling water within the passage 12a. In this manner, the temperature controller 12 suppresses the occurrence of a temperature distribution by maintaining she temperature of the internal space of the optical path protecting member 10 to be constant, so that the influence of heat convection which may be formed in the internal space can be reduced. Note that the passage 12a is not limited to the one directly formed on the inner surfaces of the optical path protecting member 10 but may also be, for example, a tubular member disposed on the inner surfaces of the optical path protecting member 10 by welding or adhesion. Furthermore, a fluid to be circulated within the passage 12a is not limited to cooling water but may be, for example, a liquid other than water or gas such as air. Furthermore, the optical path protecting member 10 has an insulator (vacuum insulator) 13 for reducing susceptibility to the temperature of external air on the outer wall (the outer circumferential portion) thereof. While, in the example shown in FIG. 1, the insulator 13 is attached to the outer wall of the optical path protecting member 10, the insulator 13 may also be attached to the inner wall of the optical path protecting member 10.

As described above, according to the present embodiment, an interferometer system, for example, that is advantageous to reduction of a measurement error when the position of an object to be measured is measured by using a laser interferometer may be provided.

Figure 2A:
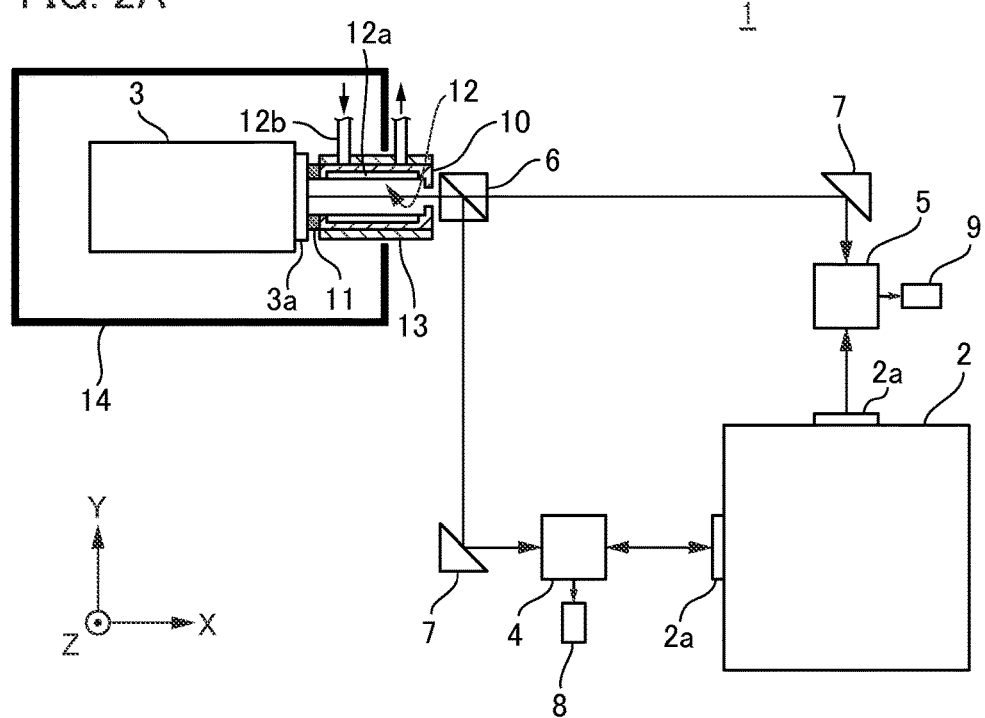
FIG. 2A is a diagram illustrating a configuration of an interferometer system according to the first embodiment of the present invention.
Figure 2B:
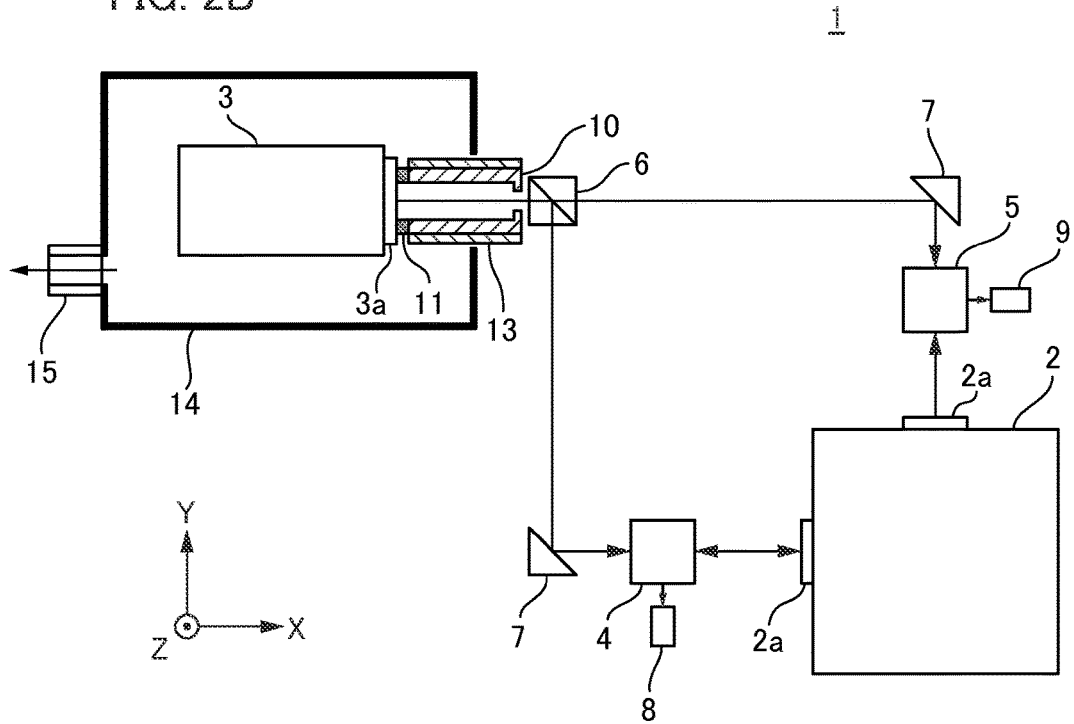
FIG. 2B is a diagram illustrating a configuration of an interferometer system according to the first embodiment of the present invention.

The following variation may also be made for the configuration of the interferometer system 1 described in the above embodiment. FIGS. 2A and 2B are schematic diagrams illustrating variant examples of the configuration of the interferometer system 1. Firstly, as shown in FIG. 2A, the interferometer system 1 has a light source cover 14 that encloses and surrounds the housing 3 including the laser-emitting source. The light source cover 14 has an opening only at its portion through which the optical path protecting member 10 which is brought into connection with the housing 3 including the laser-emitting source extends. With the above configuration, in addition to the effect provided by the optical path protecting member 10, heat transmission and thermal conductivity from the housing 3 including the laser-emitting source to she exterior environment can also be reduced, resulting in a measurement with higher accuracy. Furthermore, with this configuration, as shown in FIG. 2B, an exhauster (vent mechanism) 15 for exhausting internal gas to the outside can be provided in she light source cover 14, so that the heat in the internal space of the light source cover 14 can be efficiently recovered. Thus, other countermeasures against heat, such as additional provision of the aforementioned temperature controller 12 or the like, can be omitted by employing the above configuration.

Second Embodiment

Figure 3:
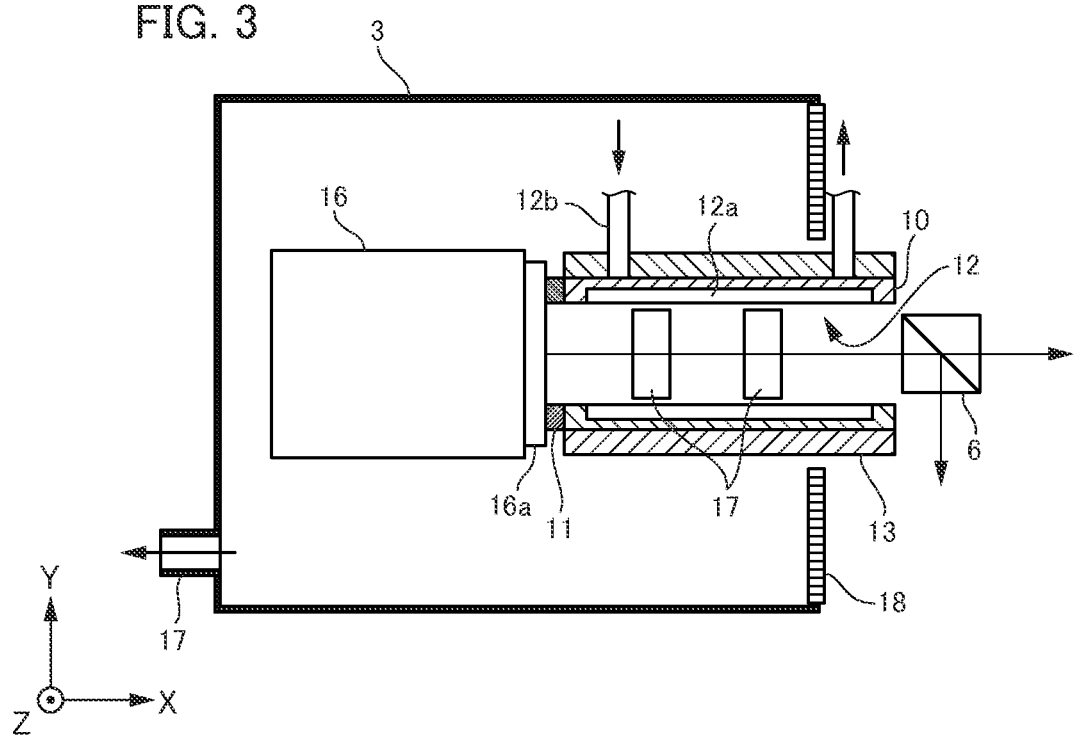
FIG. 3 is a diagram illustrating a configuration of an interferometer system according to a second embodiment of the present invention.
Figure 4:
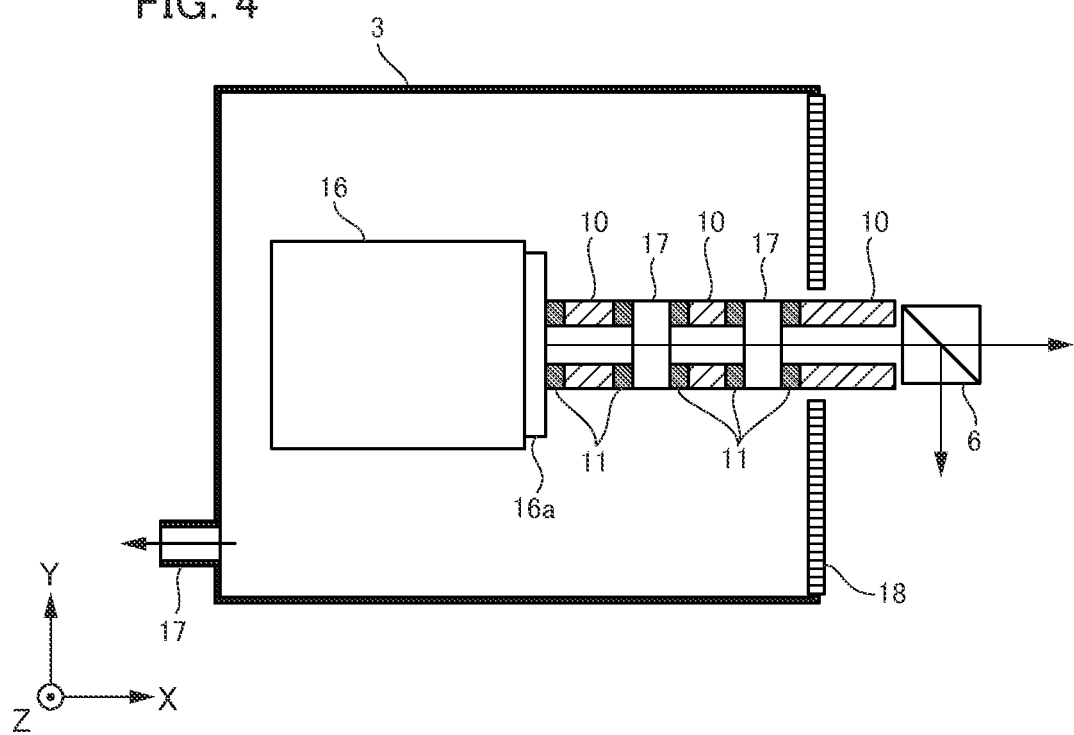
FIG. 4 is a diagram illustrating a configuration of an interferometer system according to the second embodiment of the present invention.
Figure 5:
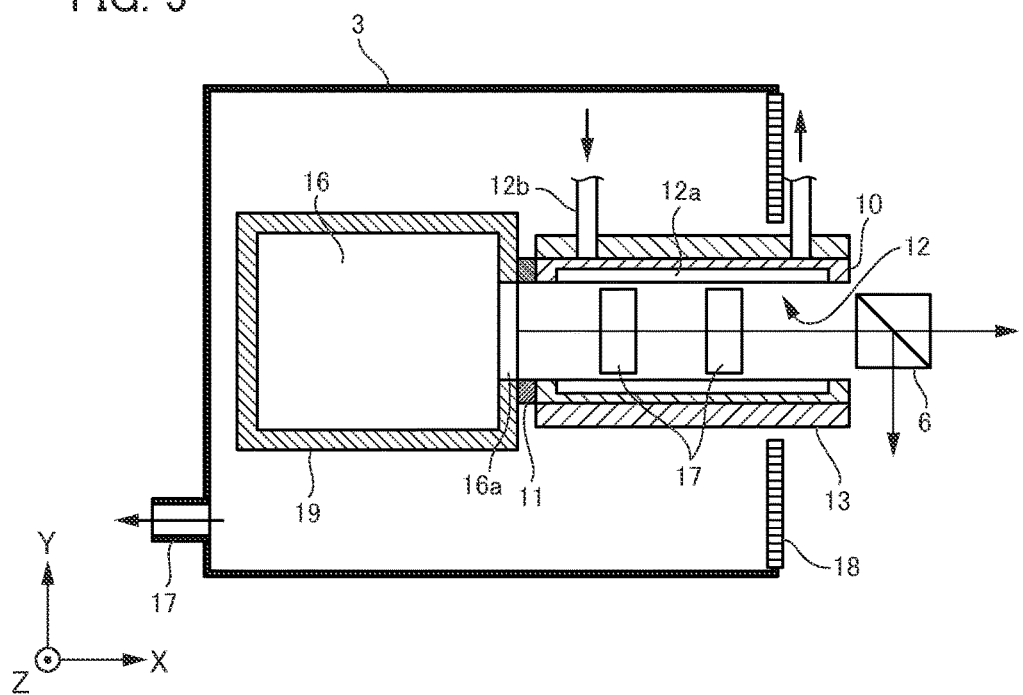
FIG. 5 is a diagram illustrating a configuration of an interferometer system according to she second embodiment of the present invention.

Next, a description will be given of an interferometer system according to a second embodiment of the present invention. While, in the first embodiment, the laser light source is a housing of a product including a light-emitting source therein, a feature of the interferometer system of the present embodiment lies in the fact that the laser light source is a light-emitting source directly emitting laser light, such as a laser tube or the like. Each or FIGS. 3 to 5 is a schematic diagram illustrating a configuration of the vicinity of the housing 3 including a laser tube 16 in the interferometer system of she present embodiment. In FIGS. 3 to 5, she elements corresponding to the configuration of the interferometer system 1 shown in FIG. 1 of the first embodiment have the same reference numerals. The laser tube 16 amplifies the excited laser light by reflecting and reciprocating it between two mirrors (not shown) at opposite ends thereof to thereby emit it as laser light. The laser light emitted from the laser tube 16 is emitted to outside through the opening provided in the housing 3 via an optical component 17 such as a beam expander for expanding the beam diameter of the laser light. A heater (not shown) is provided on the inside or outside of the laser tube 16 in order to stabilize the wavelength of laser light so that the temperature of the laser tube 16 is controlled. Thus, the laser tube 16 also serves as a heat generating source. The optical path protecting member 10 is arranged so as to enclose the laser light and the optical component 17 therein. One opening of the optical path protecting member 10 (the opening on the laser light-incidence side) is brought into contact with the emission opening 16a of the laser tube 16 via the sealing member (sealing member) 11. The housing 3 has an opening only at its portion through which the optical path protecting member 10 extends. The other opening of the optical path protecting member 10 (the opening on the laser light-emission side) is positioned in close proximity of the beam splitter 6. In this manner, the heat convection caused by the laser tube 16 is blocked, so that the interface between airs having different refractive indices can be suppressed from being changed in the optical path of laser light.

As shown in FIG. 3, an exhauster (vent mechanism) 17 for exhausting internal gas to the outside may be provided in the housing 3. In this manner, the gas in the internal space of the housing 3 can be efficiently recovered. A temperature controller 18 may also be provided in the housing 3. It is preferable that the temperature controller 18 is provided in the vicinity of the opening, through which the optical path protecting member 10 extends, provided in the housing 3. The temperature controller 18 performs temperature control such that a temperature near the opening of the housing 3 is a predetermined temperature. The predetermined temperature is the ambient temperature of the space surrounding the housing 3. The temperature controller 18 can control the temperature of the space near the opening extending between the inside and the outside of the housing 3, so that the heat convection caused by the laser tube 16 is efficiently suppressed. In this manner, a temperature gradient that occurs at the periphery of laser light near the opening can be reduced, resulting in the suppression of a measurement error caused thereby.

On the other hand, while the optical path protecting member 10 is configured to hold the optical component 17 therein in the example shown in FIG. 3, a plurality of optical path protecting members 10 may also be arranged in contact with the optical component 17 so as not to hold the optical component 17 therein as shown in FIG. 4. In this case, a plurality of optical path protecting members 10 is provided between the laser tube 16 and the optical component 17, between the optical components 17, and between the optical component 17 and the beam splitter 6 via tight contact members 11. In this manner, the heat convection caused by the optical component 17 can be suppressed.

Furthermore, a temperature controller 19 may also be provided on the outer periphery of the laser tube 16 as shown in FIG. 5. In this case, the temperatures of the temperature controllers 12, 18, and 19 are set to be the same. When the temperature of external air (the space outside the housing 3 including the laser-emitting source) is adjusted to be constant, the temperatures of the temperature controllers 12, 18, and 19 are set to be the same as the temperature of external air. In this manner, heat convection does not occur at the periphery of laser light and a temperature distribution is not produced in air, so that the occurrence of an angle change of laser light can be more efficiently suppressed.

(Lithography Apparatus)

Figure 6:
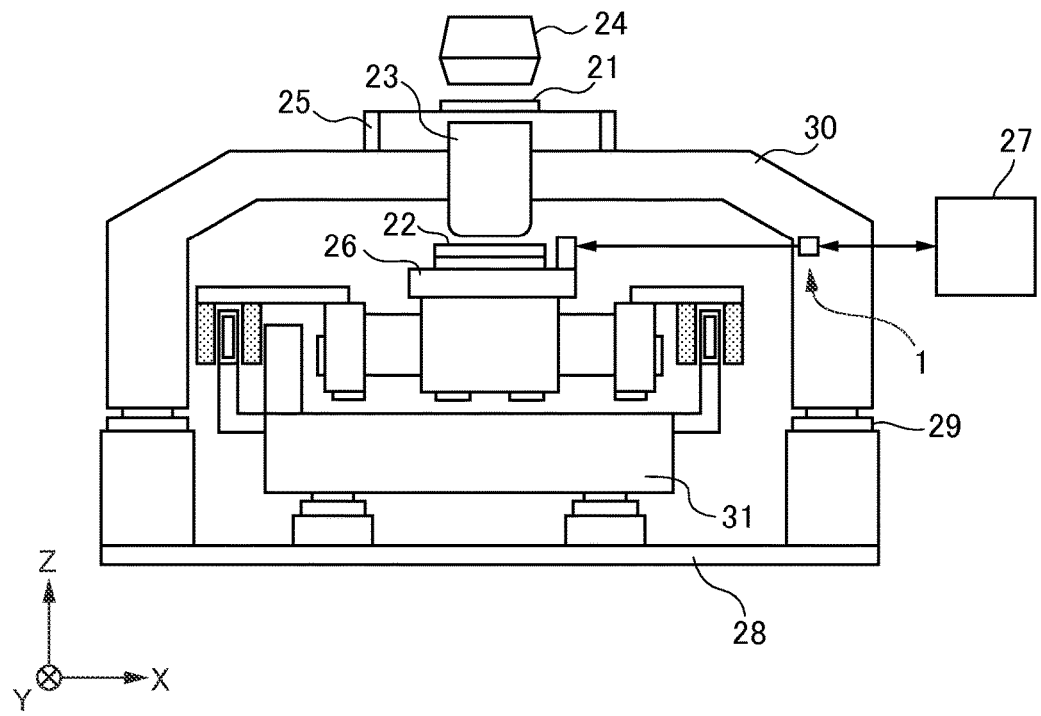
FIG. 6 is a diagram illustrating a configuration of an exposure apparatus according to one embodiment of the present invention.
Figure 7A:
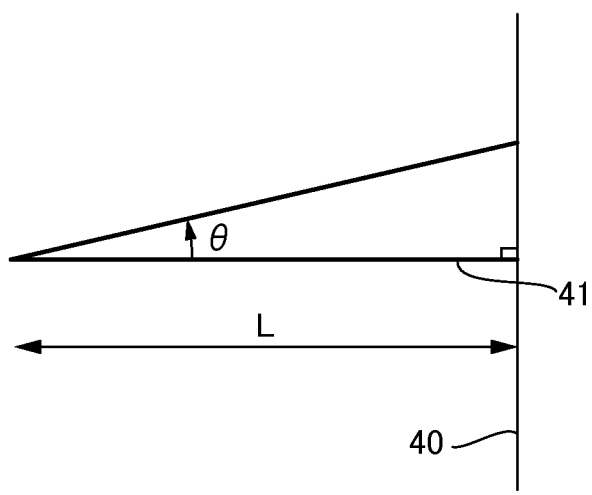
FIG. 7A is a diagram illustrating a measurement error of an interferometer system.
Figure 7B:
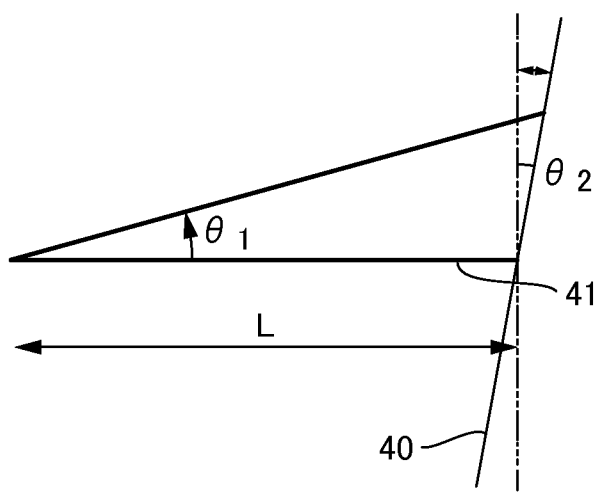
FIG. 7B is a diagram illustrating a measurement error of an interferometer system.

Next, a description will be given of a lithography apparatus according to one embodiment of the present invention. FIG. 6 is a schematic diagram illustrating a configuration of the exposure apparatus 20 as an exemplary lithography apparatus of the present embodiment. The exposure apparatus 20 is a projection type exposure apparatus that is used for steps of manufacturing semiconductor devices and transfers and exposes a pattern (e.g., circuit pattern) formed on a reticle (original) 21 using a step-and-repeat system onto a wafer 22 (substrate), i.e., a substrate to be treated. Note that she exposure apparatus 20 is not limited to the step-and-repeat system but the exposure apparatus 20 of the step-and-scan system may also be employed. In FIG. 6, the Z-axis is defined in a direction parallel to the optical axis (in the present embodiment, vertical direction) of a projection optical system 23 and the X-axis and the Y-axis are defined in two directions orthogonal to each other within a plane perpendicular to the Z-axis. The exposure apparatus 20 includes an illumination system 24, an original stage 25, a projection optical system 23, a substrate stage 26, and a controller 27. The illumination system 24 includes optical elements such as a lens, a mirror, a light integrator, an aperture, and the like and irradiates the reticle 21 with light by adjusting the light emitted from a light source not shown). As a light source, a pulse laser light source may be employed. The reticle 21 is, for example, an original made of quartz glass. A pattern to be transferred onto the wafer 22 is formed on the reticle 21. The original stage (holder) 25 is movable in the XY-axis directions while holding the reticle 21. The projection optical system 23 projects and exposes the pattern on the reticle 21, which has been illuminated with exposure light from the illumination system 24, onto the wafer 22 with a predetermined magnification (e.g., ½ to ⅕). Note that the original stage 25 and the projection optical system 23 are supported by a barrel surface plate 30 which is installed on a surface plate 28 and includes a vibration isolating member 29. The wafer 22 is made of single crystal silicon or the like. A resist (photoresist) is applied to the surface thereof. The substrate stage (holder) 26 is movable in at least the XY-axis directions while holding the wafer 22. Note that the substrate stage 26 is installed on a stage surface plate 31 mounted on the surface plate 28. Furthermore, the controller 27 may control the operation, adjustment, and the like of the components provided in the exposure apparatus 20. In particular, in the exposure apparatus 20, the original stage 25 or the substrate stage 26 is treated as the object to be measured 2 and the interferometer system 1 described above is employed as an apparatus for measuring the position of the original stage 25 or the substrate stage 26. According to the exposure apparatus 20 of the present embodiment, the interferometer system 1 which is preferable for reducing a measurement error is employed, so that a pattern image from the projection optical system 23 can be aligned with a pattern forming-region on the wafer 22 with high accuracy. While, in the present embodiment, a description has been given of an exposure apparatus as a lithography apparatus, the lithography apparatus is not limited thereto but may also be a lithography apparatus including at least one of a movable original, stage and a movable substrate stage. For example, the lithography apparatus may also be a lithography apparatus that performs writing on a substrate (a photoresist coated on the substrate) with a charged particle beam such as an electron beam or may also be an imprint apparatus that forms (molds) an imprint material on a substrate using a mold to thereby form a pattern on the substrate.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-006617 filed on Jan. 17, 2013, which is hereby incorporated by reference herein in its entirety.

What is claimed is:

1. An interferometer system that irradiates an object to be measured with measuring light to thereby measure a position of the object to be measured, the interferometer system comprising:
    a laser light source including an emission opening from which laser light is emitted;
    a member including a first opening through which the laser light emitted from the emission opening enters, and configured to surround an optical path of the laser light;
    a light source cover configured to surround the laser light source and only a part of the member; and
    an interferometer configured to separate the laser light which passes through the first opening into the measuring light and reference light and that is provided on an outside of the light source cover such that an optical path of the measuring light is external to the light source cover,
    wherein an emission portion included in the laser light source including the emission opening is brought into contact with a first portion included in the member including the first opening.

2. The interferometer system according to claim 1, wherein the member includes a second portion including a second opening through which the laser light from the first portion passes, the second portion is outside the light source cover.

3. The interferometer system according to claim 1, wherein the first portion is brought into contact with the emission portion via a sealing member.

4. The interferometer system according to claim 1, wherein the member includes a temperature controller that controls a temperature of an internal space thereof to be constant.

5. The interferometer system according to claim 4, wherein the temperature controller further comprises:
    a passage configured to circulate a liquid or gas of which the temperature has been adjusted,
    a supply unit configured to supply the liquid or the gas to the passage, and a recovery unit configured to recover the liquid or the gas from the passage.

6. The interferometer system according to claim 1, wherein the member has an insulator which is provided on at least one of an inner wall or an outer wall thereof.

7. The interferometer system according to claim 1, further comprising:
    an exhauster configured to evacuate the interior of the light source cover.

8. The interferometer system according to claim 1, further comprising:
    a temperature controller configured to control the temperature of a space through which a laser emitted from the laser light source passes.

9. The interferometer system according to claim 1, wherein the laser light source is a laser-emitting source comprising two mirrors used for amplifying the laser light and placed at opposite ends thereof, wherein the light source cover is a housing.

10. The interferometer system according to claim 1, wherein the member includes a second opening from which the laser light having passed through the first opening is emitted, wherein the laser light from the second opening enters the interferometer.

11. The interferometer system according to claim 1, wherein the light source cover includes an opening through which the member passes such that the part of the member is inside of the light source cover and a remainder part of the member is outside of the light source cover.

12. The interferometer system according to claim 11, wherein the member passes through the opening so as to cover an entirety of the optical path of the laser light in the light source cover.

13. A lithography apparatus that forms a pattern on a substrate, the lithography apparatus comprising:
    a holder configured to hold an original or the substrate, and to be moved; and
    an interferometer system configured to irradiate the holder with measuring light to thereby measure a position of the holder,
    wherein the interferometer system comprises:
        a laser light source including an emission opening from which laser light is emitted;
        a member including a first opening through which the laser light emitted from the emission opening enters, and configured to surround an optical path of the laser light;
        a light source cover configured to surround the laser light source and only a part of the member; and
        an interferometer configured to separate the laser light which passes through the first opening into the measuring light and reference light and that is provided on an outside of the light source cover such that an optical path of the measuring light is external to the light source cover,
        wherein an emission portion included in the laser light source including the emission opening is brought into contact with a first portion included in the member including the first opening.

14. A method of manufacturing an article, the method including:
    forming a pattern on a substrate using a lithography apparatus; and
    processing the substrate, on which the pattern has been formed, to manufacture the article,
    wherein the lithography apparatus comprises:
        a holder configured to hold an original or the substrate, and to be moved; and
        an interferometer system configured to irradiate the holder with measuring light to thereby measure a position of the holder,
    wherein the interferometer system comprises:
        a laser light source including an emission opening from which laser light is emitted;
        a member including a first opening through which the laser light emitted from the emission opening enters, and configured to surround an optical path of the laser light;
        a light source cover configured to surround the laser light source and only a part of the member; and
        an interferometer configured to separate the laser light which passes through the first opening into the measuring light and reference light and that is provided on an outside of the light source cover such that an optical path of the measuring light is external to the light source cover,
        wherein an emission portion included in the laser light source including the emission opening is brought into contact with a first portion included in the member including the first opening.

* * * * *